(12) United States Patent
Pan

(10) Patent No.: US 6,325,639 B1
(45) Date of Patent: Dec. 4, 2001

(54) I/O CONNECTOR FOR A PORTABLE COMMUNICATIONS DEVICE

(75) Inventor: Long-Jyh Pan, Taipei Hsien (TW)

(73) Assignee: Acer Communications and Multimedia Inc., Taoyuan (TW)

( * ) Notice: Subject to any disclaimer, the term of this patent is extended or adjusted under 35 U.S.C. 154(b) by 0 days.

(21) Appl. No.: 09/620,130

(22) Filed: Jul. 20, 2000

(51) Int. Cl.⁷ .................................................. H01R 9/09
(52) U.S. Cl. ................................................... 439/76.1
(58) Field of Search ............................... 439/76.1, 79, 80, 439/620; 124/52.4; 228/180

(56) References Cited

U.S. PATENT DOCUMENTS 3,550,062 * 12/1970 Drenten et al. ............................ 439/64
4,785,533 * 11/1988 Seinto et al. ............................ 174/52.4
5,865,648 * 2/1999 Clyatt, III ............................ 439/620

OTHER PUBLICATIONS

The IBM Technical Disclosure vol. 29 No. 6. Published date Nov. 1986.*

* cited by examiner

*Primary Examiner*—Neil Abrams
*Assistant Examiner*—Phuong KT Dinh
(74) *Attorney, Agent, or Firm*—Winston Hsu

(57) ABSTRACT

A portable communications device has a housing with a circuit board set within the housing. An I/O connector has an interface connector that mounts on the housing. The interface connector thus has internal and external sides. Conductors on the external side present an I/O interface for an external device. These conductors have corresponding contacts on the internal side. The contacts on the internal side make electrical connections with contacts set on an edge of the circuit board.

10 Claims, 9 Drawing Sheets

I/O CONNECTOR FOR A PORTABLE COMMUNICATIONS DEVICE

BACKGROUND OF THE INVENTION

1. Field of the Invention

The present invention relates to an input/output (I/O) connector for a portable communications device. More specifically, the present invention discloses an I/O connector that requires less surface area on a circuit board.

2. Description of the Prior Art

I/O connectors are used in a wide variety of electronic devices to electrically connect different types of devices to each other. In particular, such connectors are found on portable communications devices, such as cellular telephones. They may perform a variety of functions, such as the connecting of the cellular telephone to a computer to establish a communications link, or the docking of the cellular telephone to a docking station for the recharging of batteries, etc.

I/O ports are traditionally mounted on a circuit board of the personal communications device, and protrude through the casing to establish an electrical connection between the circuitry on the circuit board and an external device. Please refer to FIG. 1. FIG. 1 is an exploded view diagram of a prior art cellular telephone 10. The cellular telephone 10 is a well-known portable personal communications device, and comprises a circuit board 12 set between an upper casing 14 and a lower casing 16. The circuit board 12 has a prior art I/O connector 20 electrically connected to other devices (not shown) disposed on the circuit board 12. Various methods are used to establish the electrical connection between the I/O connector 20 and the devices on the circuit board 12, which are discussed below. The I/O connector 20 has an external interface end 22 that is used to electrically connect to a corresponding I/O connector on a separate device (not shown). Besides comprising a plurality of electrical contacts 24 to establish electrical connections with the external device, the I/O connector 20 may also optionally comprise a locking mechanism 26 to establish a firm mechanical connection between the respective devices. In this manner the cellular telephone 10 will not become unintentionally unplugged from the external device. The upper and lower casings 14 and 16 each have an opening 18. When the upper and lower casings 14 and 16 are brought together, the circuit board 12 is held snugly between them and the external interface end 22 peeks through the opening 18 so that it can mate with its corresponding connector on the external device.

As noted above, a variety of methods can be used to electrically connect the I/O connector 20 to the other components on the circuit board 12. The most commonly used method is surface mounting technology (SMT). Please refer to FIG. 2, which is a diagram of the prior art I/O connector 20 mounted to the circuit board 12 using SMT. Protruding from the back end of the I/O connector 20 are a plurality of pins 21. Each pin 21 should have a corresponding contact 24 on the external interface end 22 of the I/O connector 20. Using SMT, the pins 21 are soldered to the circuit board 12 at predetermined soldering points 23. These soldering points 23 have traces (not shown) which lead away from the soldering points and electrically connect to other components on the circuit board 12. Using SMT, the I/O connector 20 is firmly fixed to the circuit board 12.

Alternatively, the I/O connector 20 may simply clamp onto the circuit board 12. This is depicted in FIG. 3. The circuit board 12 can have a variety of traces (not shown) on both its top and bottom surfaces. These traces lead up to the edge of the circuit board 12. The I/O connector 20 has a plurality of elastic contacts 25 that electrically connect to their corresponding contacts 24 on the external interface end 22. When the I/O connector 20 is slid onto the edge of the circuit board 12, the elastic contacts 25 make electrical contact with their respective traces, and also firmly hold the I/O connector 20 to the circuit board 12. When disposed within the upper and lower casings 14 and 16, the casings 14, 16 prevent the I/O connector 20 from sliding back off the circuit board 12 if it is pulled or jerked.

Another method used to connect the I/O connector 20 to the circuit board 12 is depicted in FIG. 4. The method is very similar to that discussed in FIG. 3. Traces (not shown) lead up to an edge of the circuit board 12. A plurality of elastic conductors 27, each connected to a corresponding contact (not shown) on the external interface end 22, make electrical contact with their respective traces. However, instead of clamping onto the circuit board 12, as is done in FIG. 3, the I/O connector 20 is held in place by the upper and lower casings 14 and 16, which both firmly press the I/O connector 20 against the circuit board 12 and also locks it into position.

All of the above prior art methods used to electrically connect the I/O connector 20 to the circuit board 12 require a significant amount of area on the circuit board 12 in comparison to the area of the I/O connector 20. That is, a large portion of the I/O connector 20 actually resides on the circuit board 12, taking up space. With the continuing trend of reducing the sizes of portable communications devices, the total size of the circuit board must also be reduced. This, however, is hampered by the area consumed on the circuit board 12 by the I/O connector 20. Hence, the prior art I/O connector 20 is inhibiting miniaturization trends in portable communications devices.

Additionally, a limited tolerance is permitted between the I/O connector 20 and its opening 18 in the casings 14 and 16. Small misalignments of the circuit board 12 in the casings 14, 16, or of the I/O connector 20 on the circuit board 12 can result in difficulty, or a complete failure, to mate the upper casing 14 with the lower casing 16. Consequently, the prior art method of mounting the I/O connector 20 onto the circuit board 12 exacerbates tolerance requirements, and complicates the manufacturing process of the cellular telephone 10.

SUMMARY OF THE INVENTION

It is therefore a primary objective of this invention to provide an input/output (I/O) connector that requires very little area on a circuit board, and which can be easily mounted within the casings of a portable communications device.

The present invention, briefly summarized, discloses an input/output (I/O) connector for a portable communications device. The portable communications device has a housing with a circuit board set within the housing. The I/O connector has an interface connector that mounts on the housing. The interface connector thus has an internal and an external side. Conductors on the external side present an I/O interface for an external device. These conductors have corresponding contacts on the internal side. The contacts on the internal side make electrical connections with contacts set on an edge of the circuit board.

It is an advantage of the present invention that the contacts on the edge of the circuit board use almost no area on the circuit board, and thus the total area of the circuit board can be reduced. Also, because the I/O connector is mounted on the housing, assembly tolerances are relieved.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

For simplicity, a cellular telephone will be used as an example of a portable communications device in the following discussion. However, this should not be construed as meaning that the present invention may only be used in cellular telephones. Other devices, such as pagers, personal data assistants (PDA), etc. may also take advantage of the present invention.

Figure 1:
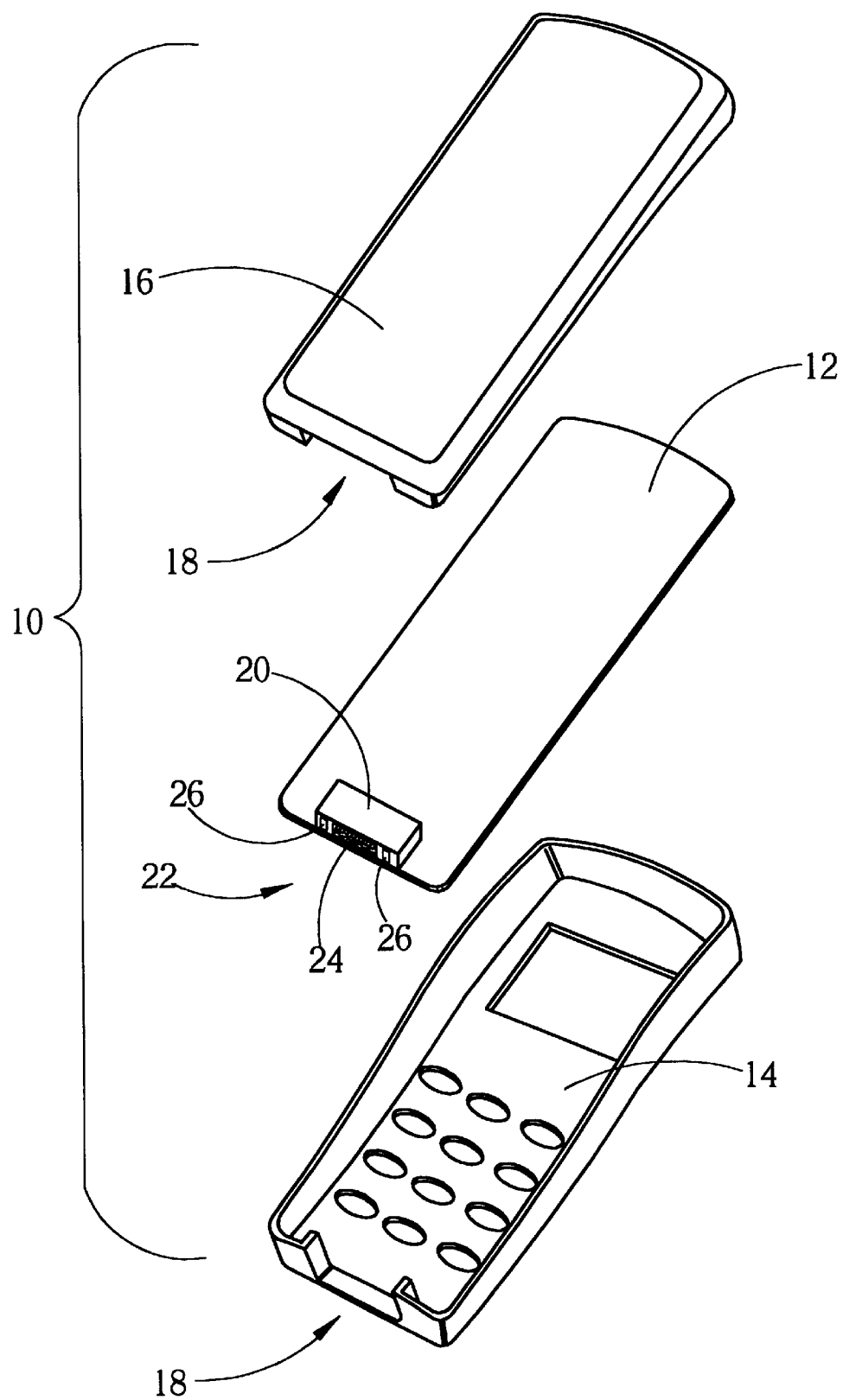
FIG. 1 is an exploded view diagram of a prior art cellular telephone with a prior art I/O connector.
Figure 2:
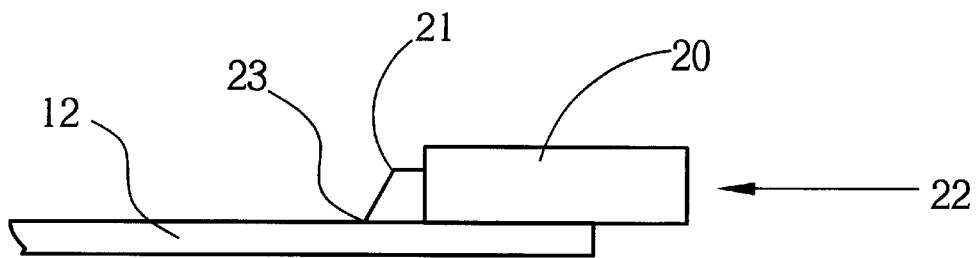
FIG. 2 is a diagram of a prior art I/O connector mounted to a circuit board using SMT.
Figure 3:
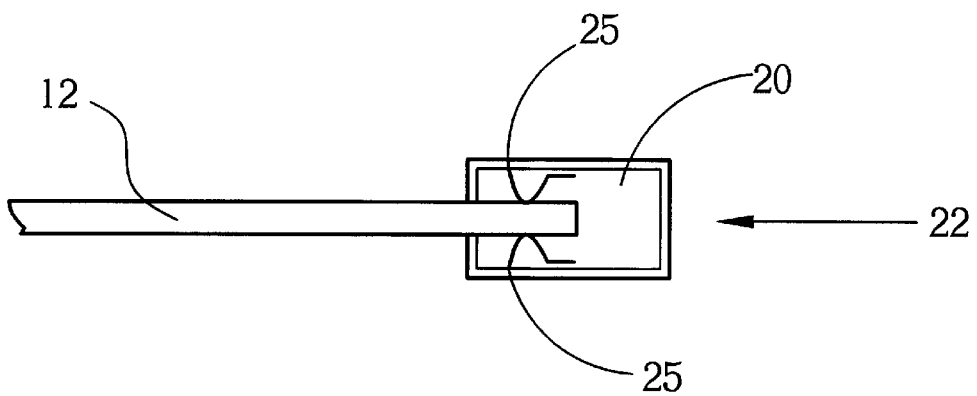
FIG. 3 is a diagram of a prior art I/O connector clamped onto a circuit board.
Figure 4:
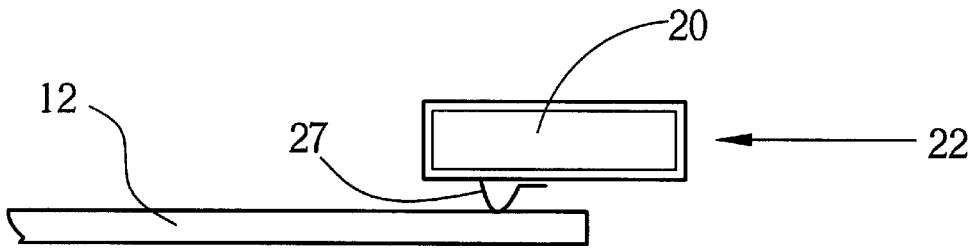
FIG. 4 is a diagram of a prior art I/O connector elastically held onto a circuit board.
Figure 5:
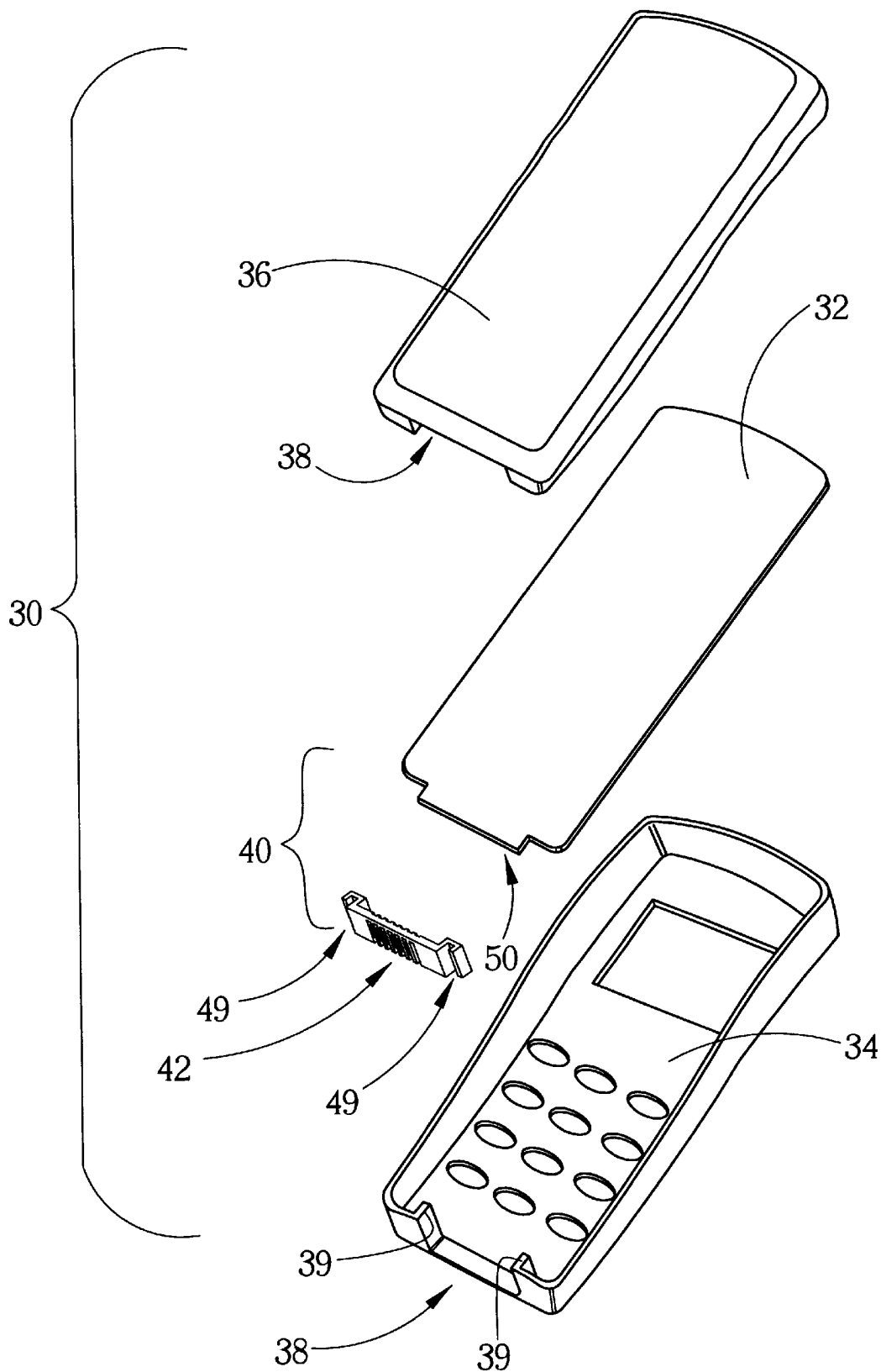
FIG. 5 is an exploded view of a cellular telephone with an I/O connector according to the present invention.
Figure 5A:
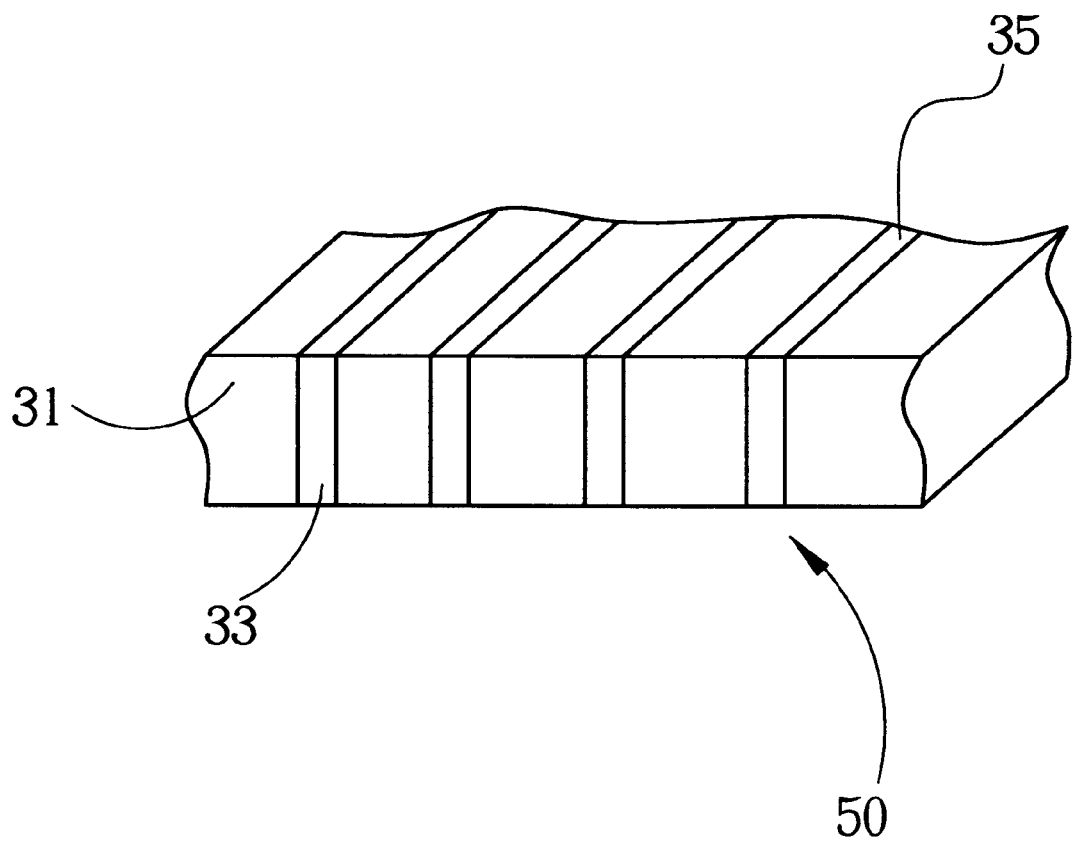

Please refer to FIG. 5. FIG. 5 is an exploded view of a cellular telephone 30 with an I/O connector 40 according to an embodiment of the present invention. The I/O connector 40 is used to electrically connect the cellular telephone 30 with an external device (not shown). The cellular telephone 30 has many components, but only those of particular relevance to the present invention will be discussed. In particular, the cellular telephone 30 has a circuit board 32 set between an upper casing 34 and a lower casing 36. The upper casing 34 and the lower casing 36 mate together to form the housing of the cellular telephone 30. An opening 38 exists in the housing, and it is in this opening 38 that the present invention I/O connector 40 is mounted.

The I/O connector 40 has two distinct parts. The first part is an interface connector 42, which mounts within the opening 38 of the housing. The second part is surface contacts 33 on an edge 31 of the circuit board 32, which is shown in detail 50. Circuit traces 35, which connect to other devices (not shown) on the circuit board 32, lead up to the edge 31, and then run down the surface of the edge 31 to form the surface contacts 33. The surface contacts 33 present an electrically conductive surface. As illustrated in FIG. 5, the interface connector 42 has tracks 49 that engage with ridges 39 on the upper casing 34. In doing so, the tracks 49 secure the interface connector 42 to the housing of the cellular telephone 30. It should be clear, however, that the exact method used to mount the interface connector 42 to the housing is relatively unimportant, so long as the interface connector 42 is set securely within the housing.

Figure 6:
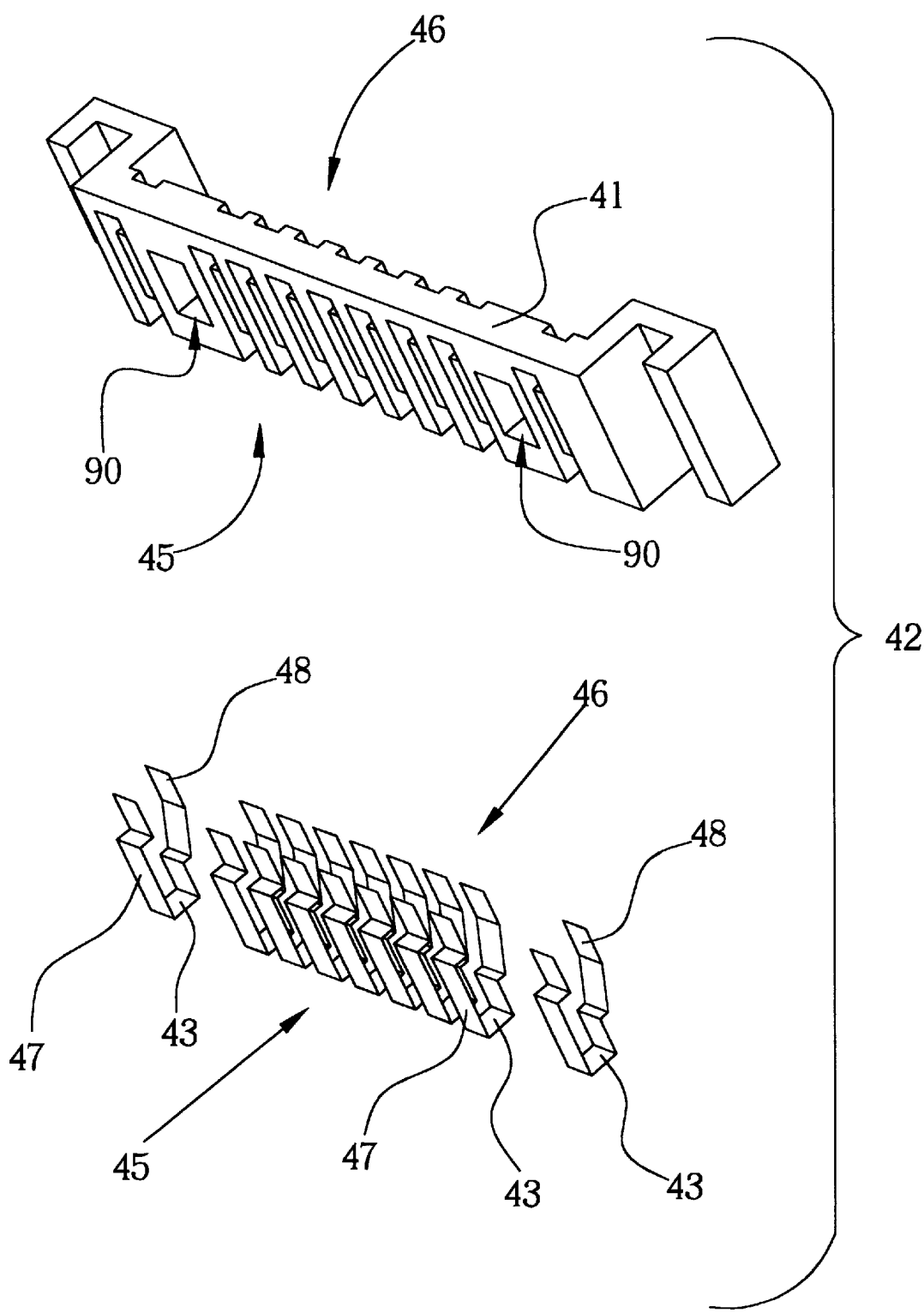
FIG. 6 is an exploded view of an interface connector in FIG. 5.

Please refer to FIG. 6 in conjunction with FIG. 5. FIG. 6 is an exploded view of the interface connector 42. The interface connector 42 comprises an electrically non-conductive shell 41 around which are wrapped electrical conductors 43. The electrical conductors 43 are shaped like a V. The shell 41 is made of plastic. The interface connector 42 has an external side 45 that peeks through the opening 38 of the housing to present an I/O interface for connecting to an external device. The external side 45 is indicated on both the shell 41 and the conductors 43 in FIG. 6. The interface connector 42 also has an internal side 46, which is inside the housing of the cellular telephone 30 and faces the edge 31 of the circuit board 32. Again, this internal side 46 is indicated on both the shell 41 and conductors 43. Consequently, the conductors 43 have external contacts 47 that present contact points for the external device on the I/O interface, as well as internal contacts 48.

When wrapped around the shell 41, the V-shaped conductors 43 present flat, electrically conductive external contacts 47 that lie flush on the external side 45 for the I/O interface. On the internal side 46, which faces the circuit board 32 inside the housing, the conductors 43 are slightly separated from the shell 41 and thus present electrically conductive internal contacts 48 that can be elastically depressed towards the shell 41. It is clear, then, that each internal contact 48 should have a corresponding external contact 47 to which it is connected. In a similar vein, each internal contact 48 should also have a surface contact 33 on the circuit board 32. Of course, these are not requirements of the invention, but are simply practicalities to prevent redundancies and useless components.

When the circuit board 32 is placed within the upper casing 34, the edge 31 of the circuit board 32 will elastically engage with the internal contacts 48. Specifically, the surface contacts 33 on the edge 31 of the circuit board 32 will electrically contact corresponding internal contacts 48. These internal contacts 48 then present an I/O interface for an external device via their corresponding external contacts 47. Consequently, each trace 35 of the circuit board 32 that leads up to the edge 31 can have a corresponding I/O interface contact for an external device.

The interface connector 42 may also have a locking mechanism to ensure the I/O interface will not become unintentionally disengaged when an external device is connected to the I/O interface. By way of example, each side of the external side 45 of the shell 41 has a locking notch 90. When plugging into the interface connector 42, a connector on the external device will have corresponding clasps that snap into the locking notches 90 to secure the external device to the I/O interface. In this manner, pulling and jerks on the external device will not cause it to become unplugged from the interface connector 42.

Figure 7:
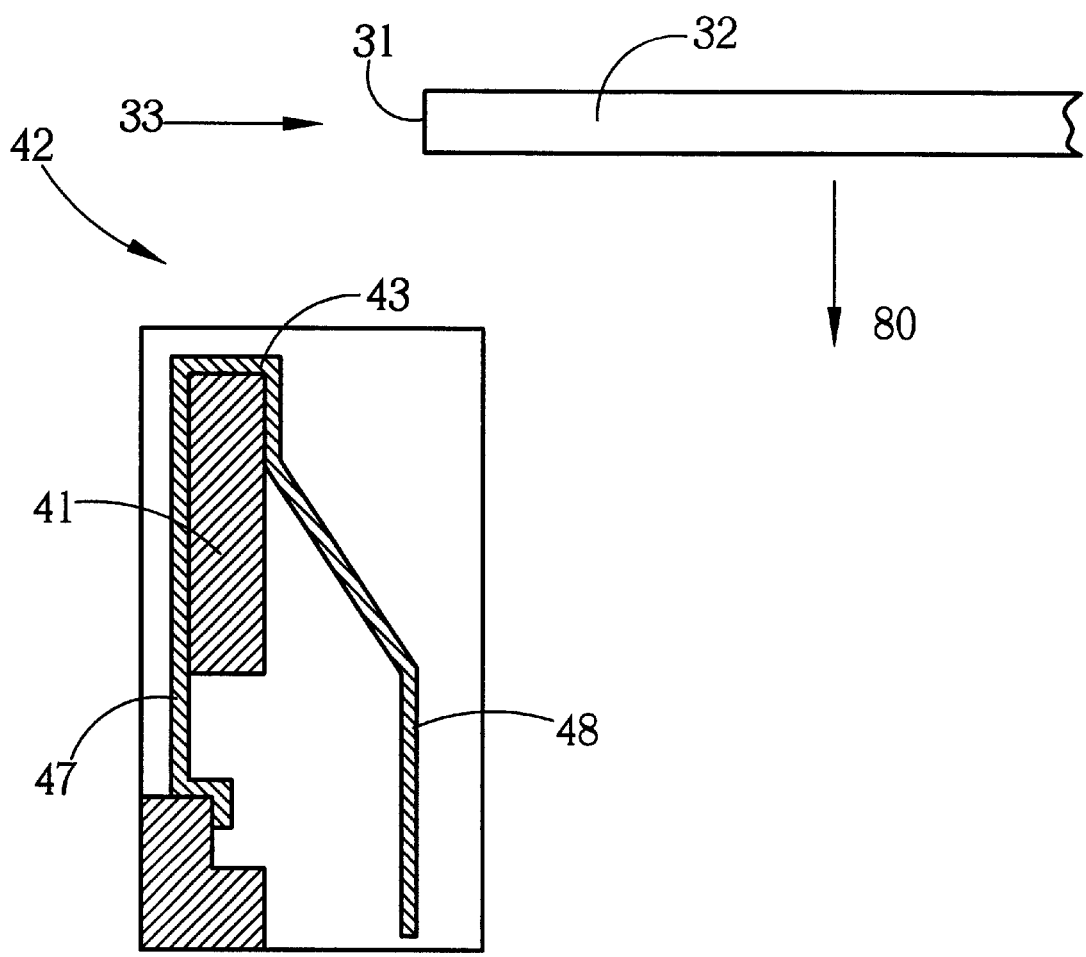
FIG. 7 is a side view of a circuit board prior to engaging with internal contacts of an interface connector of the present invention.

Please refer to FIG. 7, which is a side view of the circuit board 32 prior to engaging with the internal contacts 48 of the interface connector 42. When the circuit board 32 is placed inside the upper casing 34, the shell 41 with its conductors 43 should already have been installed in the opening 38. Consequently, as the circuit board 32 settles in the direction of arrow 80, the internal contacts 48 elastically push on the surface contacts 33 on the edge 31 to make an electrical connection between the external contacts 47 of the I/O interface and the surface contacts 33. The present invention I/O connector 40 is then in place within the housing of the cellular telephone 30.

The present invention I/O connector 40 uses only the surface contacts 33 on the circuit board 32, and consumes much less area on the circuit board 32. Consequently, the overall length of the circuit board 32 can be reduced, facilitating size reductions of the portable communications device. Moreover, because the interface connector 42 is already fixed within the housing of the communications device, tolerance concerns are limited only to lining up the internal contacts 48 with their respective surface contacts 33. There are no more tolerance considerations between the upper housing and the interface connector assembly. The upper and lower casings 34 and 36 are always guaranteed to mate together without any interference from the interface connector 42.

Figure 8:
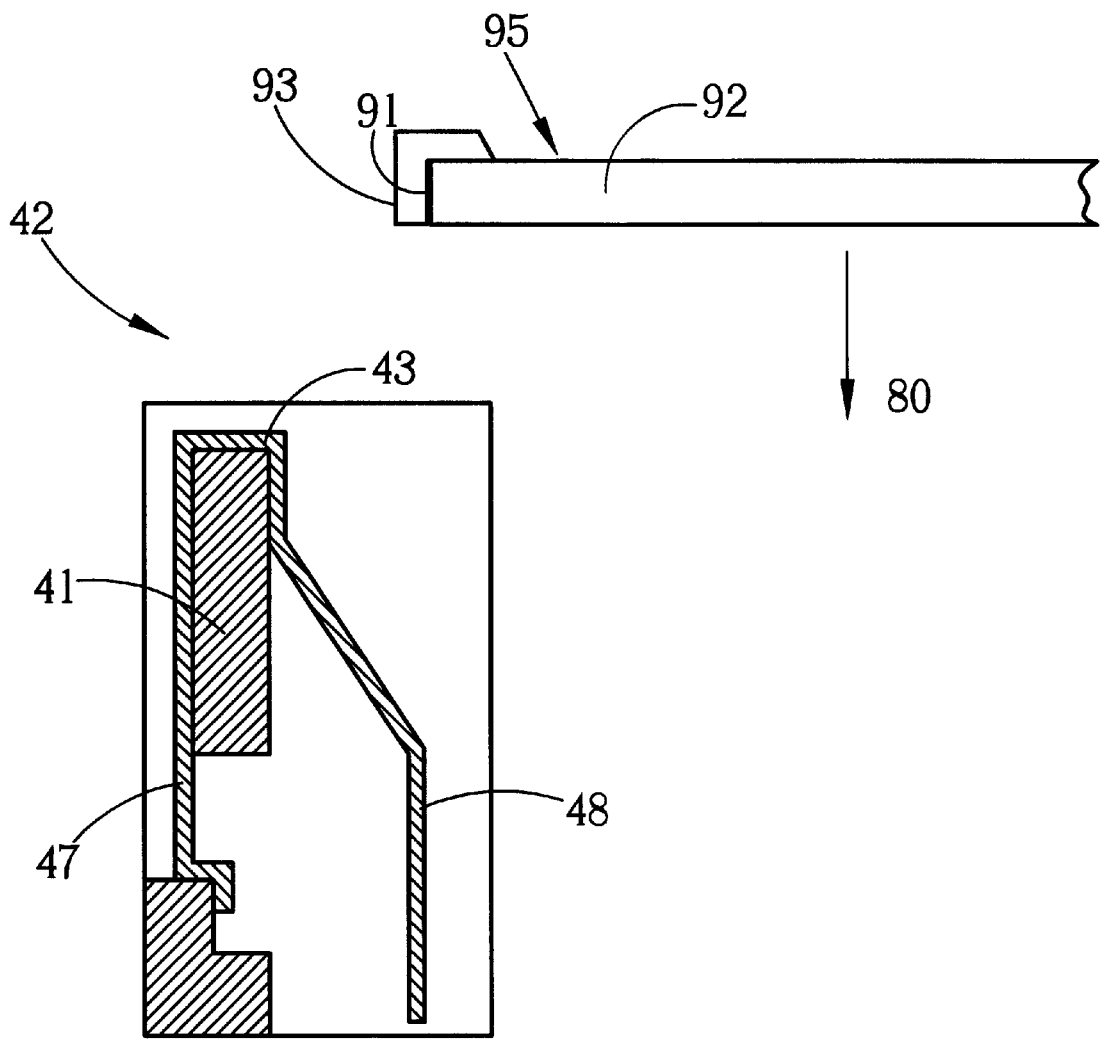
FIG. 8 is a side view of a circuit board of a first alternative embodiment of the present invention.

Although the above has disclosed the preferred embodiment of the present invention I/O connector, several variations are possible, of which a few shall now be discussed. One variation may occur with the surface contact 33. Please refer to FIG. 8. FIG. 8 is a side view of a circuit board 92 of an alternative embodiment of the present invention. As with the circuit board 32 shown in FIG. 7, the circuit board 92 engages with the interface connector 42 when it is placed within the housing of the portable communications device. However, rather than have traces which wrap around and down an edge 91 of the circuit board 92, there are instead a series of flat electrical conductors 93 that are electrically connected to traces 95 on top of the circuit board 92. These flat electrical conductors 93 bend around and down the surface of the edge 91. These conductors 93 then behave like the traces 33 of FIG. 7, and each internal contact 48 elastically engages with its corresponding conductor 93 to make an electrical connection. The conductors 93 can be soldered to the top, or bottom, of the circuit board 92, i.e., SMT can be used to fasten and electrically connect the conductors 93 to the circuit board 92. Although the area required for soldering does use some space on the circuit board, the area used is still considerably less than what would be required for an entire I/O connector that the prior art used.

Figure 9:
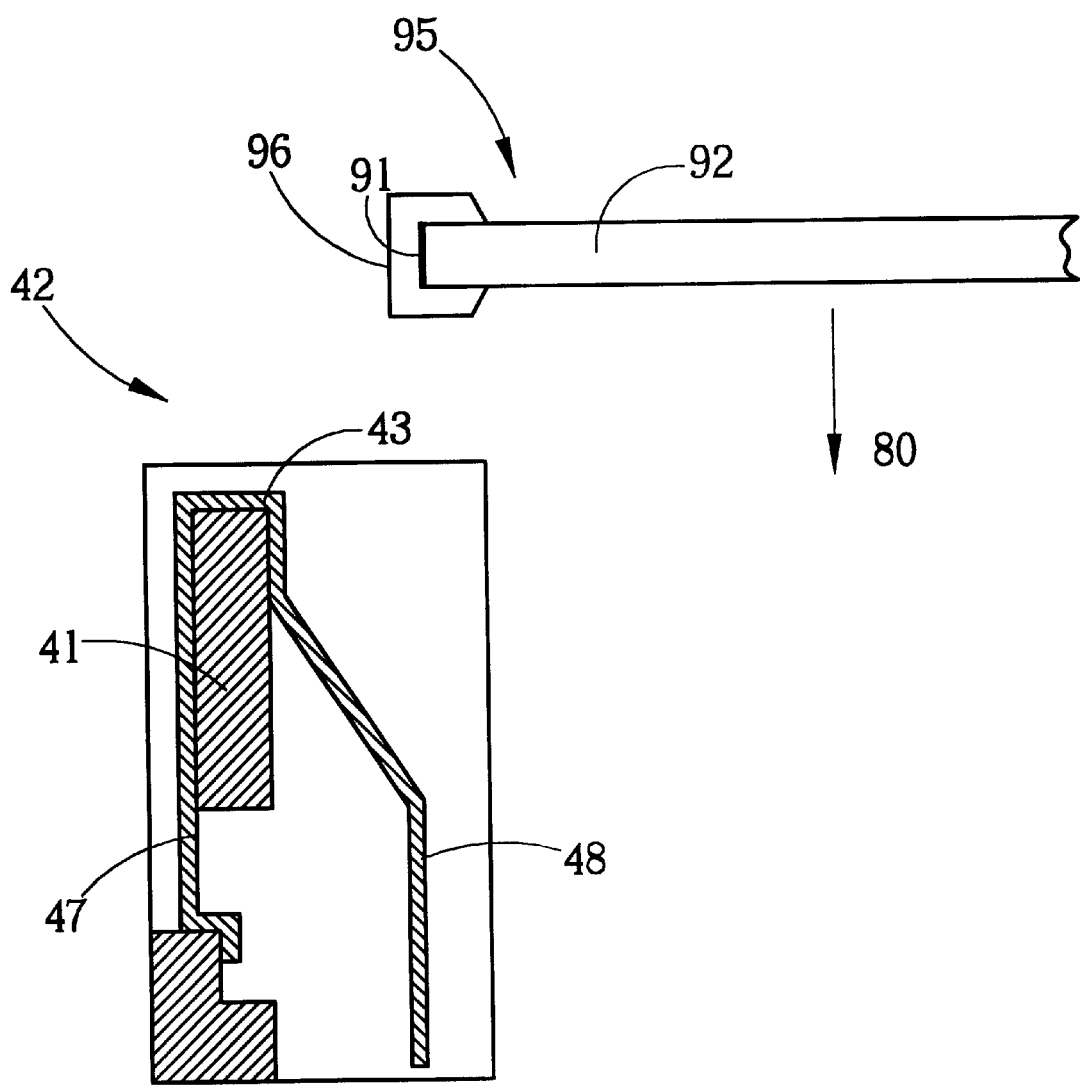
FIG. 9 is a side view of a circuit board with a clamp for a second alternative embodiment of the present invention.

A similar arrangement can be made using a clamp. Please refer to FIG. 9, which is a side view of the circuit board 92 with a clamp 96. Upper and lower portions of the clamp 96 grab the upper and lower surfaces of the circuit board 92 to secure the clamp 96 to the edge 91. Conductors on the clamp electrically connect with the traces 95 to present conductors on the edge 91 with which the internal contacts 48 elastically engage to make an electrical connection.

Figure 10:
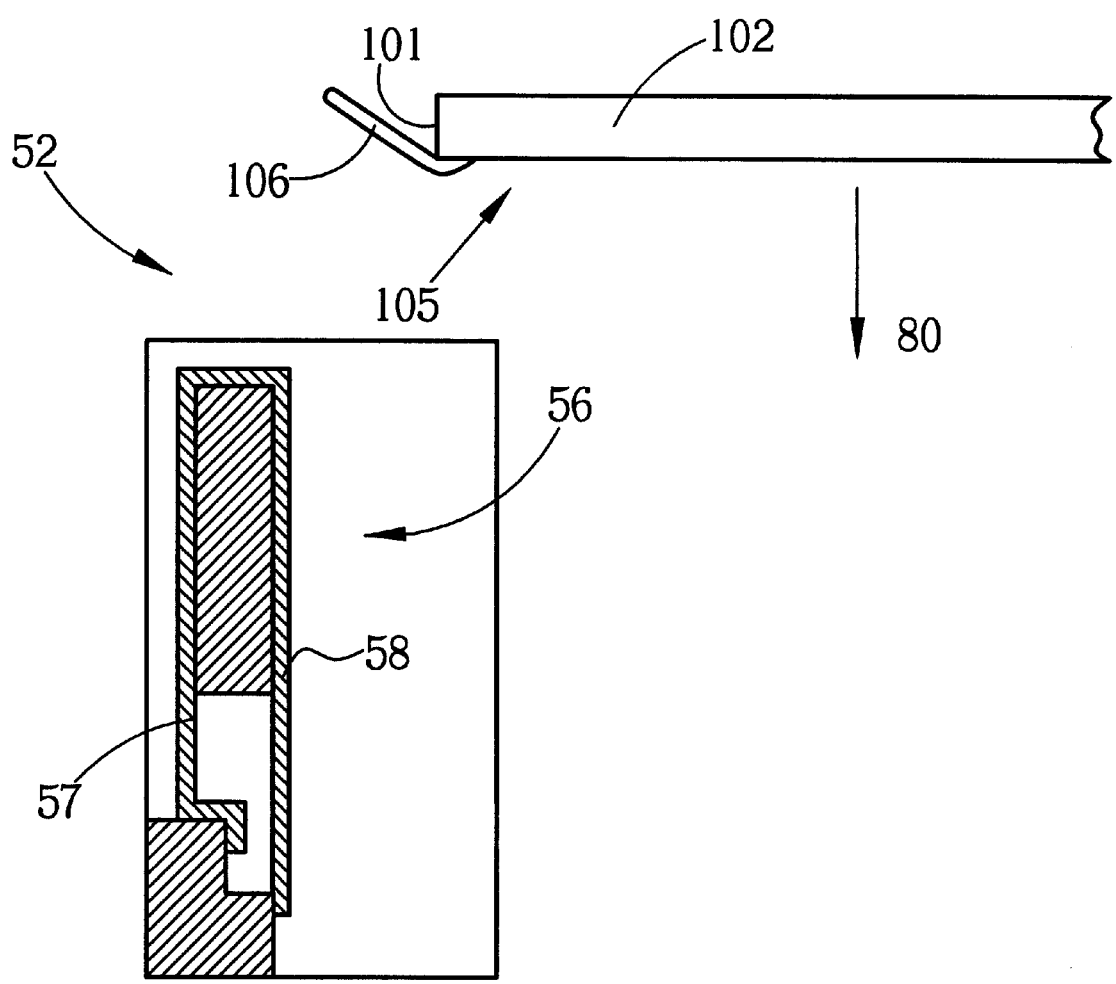
FIG. 10 is a side view of an interface connector that electrically engages with elastic electrical conductors on an edge of a circuit board according to the present invention.

Although all of the above examples have shown elastic internal connectors 48 of the interface connector 42 elastically engaging with flat and conductive surfaces on an edge of the circuit board, it should be clear that the edge of the circuit board could instead have elastic electrical conductors that engage with flat conductors on the internal side of the interface connector. Please refer to FIG. 10 for an example of another embodiment arrangement. This diagram illustrates an interface connector 52 that electrically engages with elastic electrical conductors 106 on an edge 101 of a circuit board 102. In almost all respects the interface connector 52 is identical to the previously described interface connector 42 except that internal contacts 58 lie flush with an internal side 56 of the interface connector 52. Conversely, on the circuit board 102, the flat electrical conductors 106 wrap around from traces 105 on the bottom side of the circuit board 102 to the edge 101. When the circuit board 102 is inserted into the housing, these flat conductors 106 elastically contact their corresponding internal contacts 58 to make an electrical connection with external contact 57 on the interface connector 52.

In contrast to the prior art, the present invention uses conductive surfaces on an edge of a circuit board of the portable communications device to elastically establish electrical connections with an interface connector set within the casing. Consequently, the I/O connector of the present invention uses less area on the circuit board, which facilitates the miniaturization of the portable communications device. Additionally, because the interface connector set within the housing first and contacts the circuit board when the circuit board is inserted into the housing, tolerance requirements between the circuit board, housing and the connector are reduced. This helps to ease the manufacturing of the portable communications device.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An input/output (I/O) connector for an electronic device, the electronic device comprising a housing and a circuit board disposed within the housing, the I/O connector comprising:

a surface contact located along a lateral edge surface of the circuit board; and an interface connector mounted in the housing having a conductor with an internal and an external terminal, the internal terminal in elastic contact with and electrically connecting to said surface contact, and the external terminal presenting an I/O interface for detachably connecting to an external device;

wherein when the circuit board is placed in the housing, the surface contact along the lateral edge surface of the circuit board elastically contacts the internal terminal to electrically connect to the interface connector.

2. The I/O connector of claim 1 wherein the surface contact is a circuit trace on the lateral edge surface of the circuit board.

3. The I/O connector of claim 1 wherein the surface contact is an elastic electrical conductor that wraps around from a top surface of the circuit board and along the lateral edge surface of the circuit board.

4. The I/O connector of claim 3 wherein the surface contact is part of a clamp that clamps the top surface of the circuit board.

5. The I/O connector of claim 1 wherein the internal terminal elastically contacts the surface contact.

6. The I/O connector of claim 5 wherein the surface of the interface connector is made from an electrically nonconductive material, and the terminals are substantially V-shaped electrical conductors that wrap around the interface connector, the external terminal being predominantly flush with an external side of the interface connector, the internal terminal being spaced from an internal side of the interface connector so that the internal terminal elastically contacts the surface contact.

7. The I/O connector of claim 3 wherein the surface contact elastically contacts the internal terminal.

8. The I/O connector of claim 7 wherein the surface of the interface connector is made from an electrically nonconductive material, and the terminals are substantially V-shaped electrical conductors that wrap around the interface connector, the external terminal being predominantly flush with an external side of the interface connector, the internal terminal being predominantly flush with an internal side of the interface connector.

9. The I/O connector of claim 1 wherein an external side of the interface connector further comprises a locking mechanism for engaging with a corresponding locking mechanism on a connector that connects to the external side of the interface connector.

10. The I/O connector of claim 1 wherein the electronic device is a portable communications device.

* * * * *